United States Patent [19]

Fritz

[11] Patent Number: 4,503,538
[45] Date of Patent: Mar. 5, 1985

[54] METHOD AND SYSTEM TO RECOGNIZE CHANGE IN THE STORAGE CHARACTERISTICS OF A PROGRAMMABLE MEMORY

[75] Inventor: Eberhard Fritz, Schwieberdingen, Fed. Rep. of Germany

[73] Assignee: Robert Bosch GmbH, Stuttgart, Fed. Rep. of Germany

[21] Appl. No.: 390,291

[22] Filed: Jun. 21, 1982

[30] Foreign Application Priority Data

Sep. 4, 1981 [DE] Fed. Rep. of Germany ....... 3134995

[51] Int. Cl.$^3$ ............................................. G01R 31/28
[52] U.S. Cl. ........................................ 371/28; 371/21; 364/900
[58] Field of Search ..................... 371/20, 21, 25, 28; 364/200, 900; 365/200, 201; 324/73 R

[56] References Cited

U.S. PATENT DOCUMENTS 3,655,959  4/1972  Chesnow et al. ...................... 371/28
3,916,306  10/1975  Patti ..................................... 371/28
4,335,457  6/1982  Early ..................................... 371/28

OTHER PUBLICATIONS

"Electronics", Aug. 14, 1980, article by Woods, An E-Prom's Ingerity Starts with its Cell Structure.

Primary Examiner—Jerry Smith
Assistant Examiner—Mark Ungerman
Attorney, Agent, or Firm—Frishauf, Holtz, Goodman & Woodward

[57] ABSTRACT

To recognize change in the storage characteristics of programmable memory elements, particularly EPROMs, the memory content of an addressed memory element or cell is read out, the first time, at normal design voltage level; the data so read are then again read out at a changed voltage level, for example at a higher or lower read-out voltage, or higher or lower operating voltage of the EPROM, and compared. If the data do not match, the particular memory cell will have the tendency to become defective due to loss or accumulation of charge carriers in due course although, for some time yet, the specific memory cell will function satisfactorily. Detection of errors upon operation under changed voltage conditions provides early warning of failure of a cell.

14 Claims, 2 Drawing Figures

METHOD AND SYSTEM TO RECOGNIZE CHANGE IN THE STORAGE CHARACTERISTICS OF A PROGRAMMABLE MEMORY

The present invention relates to a method and a system to determine if the storage characteristics of programmable memory elements, such as erasable programmable read-only memories (E-PROMs) change to such an extent that failure of the EPROM can be anticipated.

BACKGROUND

It is known that EPROMs can change their information content due to external influences—see "Woods" article in "Electronics" of Aug. 14, 1980, page 132. The EPROMs react in two possible ways: One memory cell, for example, may lose charge carriers and, due to that reason, change its state. It is also possible, however, that a memory cell accepts charge carriers due to external influences, which, likewise, may change the information content therein.

In order to insure that the information content in EPROMs remains, it has been proposed to read the information content in the EPROMs at recurring intervals, and then re-store the information content therein. Repeated storage of data in EPROMs, however, may detract from the storge characteristics of the EPROMs; it has been found that each new memory storage degrades the storage characteristics. Eventually, the storage cells, that is, the storage elements themselves, must be interchanged for new ones. Repetitive read-out and re-recording of memory content, whether necessary or not, and just in order to insure that the memory content remains the same, thus causes degradation of storage cells which, by themselves, would retain the memory content without change; the degradation affects goods as well as possibly marginally good, and poor or defective memory cells. Exchange of memory units, thus, will be necessary more frequently than would be the case if the information content in those EPROMs which are not defective is not re-recorded.

THE INVENTION

It is an object to improve the operation of memory cells, and particularly memory cells utilizing EPROMs which are subject to possible malfunction or degradation of memory content, by recognizing a trend towards change in memory characteristics before such change interferes with the effective recordation of data in the memory elements.

Briefly, the memory content from the memory element or cell is read out first with a predetermined read-out voltage, for example standard read-out voltage of the system; the read-out voltage then is changed—preferably for second and third read-out cycles increased and decreased, respectively (or vice versa). The stored memory content as read out the first time, and as read out the second, and third time, respectively, then are compared to determine if the output differs upon change in read-out voltage. If the output changes, and indication is obtained that the particular memory location or element or cell does not retain the information content and may, in due course, become defective and unreliable. At the time the test is made, however, the memory content still is in order so that a trend, or possible future defect, can be recognized.

The method and the system have the advantage that a simple measuring and comparison step permits recognition which memory cell will change its data within a foreseeable future time. It is thus possible to newly program a specific memory cell if it is recognized that the data may be lost, or to entirely replace the memory cell, if reprogramming is no longer possible. Early recognition of change in information content additionally permits continued operation of the memory cell which may become defective in the future for some period of time, until the opportunity presents itself for maintenance, repair, or replacement of the particular memory cell, or the overall structure or computer element of which it is a part.

The foregoing arrangement is particularly important in combination or connection with mobile equipment, such as on-board vehicular computers and the like, in which reliability of operation is of utmost importance since the function or operation of the vehicle as such depends on proper function of the computer apparatus. Recognition that some of the stored characteristics of the engine in the memory may change thus permits an early warning indication that maintenance of the on-board vehicular computer should be undertaken promptly.

In accordance with a particularly desirable feature of the invention, the interrogation or read-out voltage of the memory is both increased as well as decreased. Increasing the interrogation voltage permits analysis of some defect features; lowering the interrogation voltage permits analysis with respect to additional possible defects. Increasing or decreasing the interrogation of read-out voltage will depend, to some extent, on the external influences to which memory cells are exposed. Changes in memory cell characteristics can be interrogated both with increased as well as with decreased read-out voltage.

Preferably, a computer is used to provide computer controlled changes in interrogation or read-out voltages—in increasing or decreasing direction, respectively—the computer being used being, preferably, the very same one with which the memory is to cooperate. Thus, the computer can carry out the interrogation and change in the interrogation voltage and subsequent comparison of results during pauses or gaps in the program which is run on the computer.

The system to check the memory content is preferably so constructed that the supply voltage of the memory can be changed; alternatively, or simultaneously, the interrogation or read-out voltage can be changed. In a simple manner, a Schmitt trigger is provided which provides the respective output voltages, and which is so constructed that its threshold voltages can be changed; change of the level of the supply voltage is easily accomplished by changing the reference voltage of a voltage controlled or voltage stabilized supply unit. Either one, or both of these circuit components are simple and permit simple and effective interrogation with respectively changed interrogation or supply voltages.

A reference voltage or threshold voltage can be connected over an input/output (I/O) port, in dependence on a computer program which, in pauses or gaps of its normal programming run, causes voltage changes to be applied to the memory. The voltage change-over thus will be controlled by the computer program itself. Comparison between the memory content at normal read-out voltage and normal supply voltage, and changed read-out and supply voltage, can be carried out by comparators which are usually present in the computer itself. Thus, the computer can carry out the addressing of the particular memory cells, in accordance with its own program, and comparison of the contents in the address when read out under normal operating conditions and under changed read-out conditions.

In accordance with a desirable feature of the invention, an alarm or warning signal is activated, which may be optical or acoustic, if the memory content upon normal read-out conditions and changed read-out conditions differ from each other. This provides an output indication that the data content in the memory may be lost, and provides a warning to insure proper operation of the computer and the memory before loss of information or data which are stored in the memory. Reliability of controlled apparatus, for example the power train of an automotive vehicle, thus is insured since a trend towards failure of memory cells can be determined and an early warning signal given.

DRAWINGS

Figure 1:
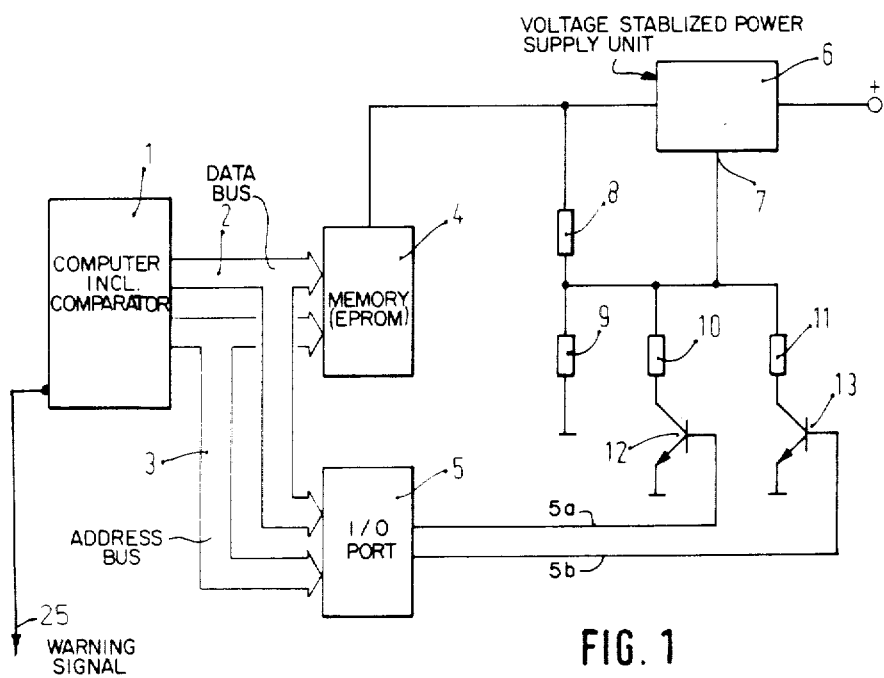
FIG. 1 is a schematic diagram illustrating the system, and the method.

A computer 1, which may be any kind of data processing apparatus and which includes a comparator in its structure, is connected over a data bus 2 with a memory 4. The memory, typically, is an EPROM. The computer is additionally connected to the EPROM over an addressing bus 3. The data bus 2 and the address bus 3 are additionally connected to an I/O port 5.

Power is supplied to the memory 4 through a voltage stabilized power supply unit 6 which is connected to a source of direct current power supply only schematically shown. The output of the stabilized power supply unit 6 is connected to the power input of the memory 4 and, additionally, to a resistor 8 which is connected in series with a resistor 9 to form a voltage divider. The tap point between the resistors 8, 9 is connected to the voltage reference input 7 of the stabilized power supply unit 6. Additionally, the tap point is connected to two parallel connected resistors 10, 11 which can be respectively switched in or out of circuit by switching transistors 12, 13 connected serially therewith. The other terminal of resistor 9, as well as the emitters of transistors 12, 13 are connected to ground or chassis.

The bases of the transistors 12 are connected to respective outputs of the I/O port 5.

The computer 1 is additionally connected to a warning signal output line 25 to provide a warning signal if incipient failure of a memory cell in memory 4 is detected.

Figure 2:
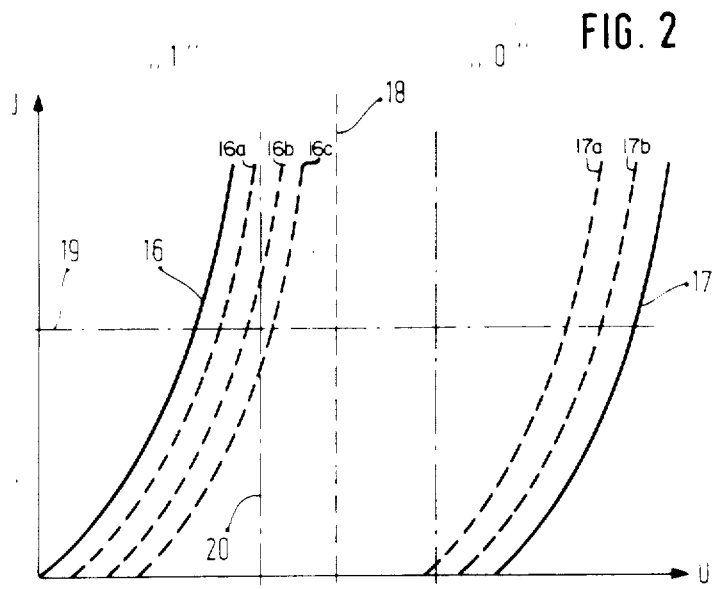
FIG. 2 are voltage (abscissa) vs. current (ordinate) graphs used in the explanation of the operation of the system of FIG. 1 and the method of determining the integrity of memory cells.

Operation, with reference to FIG. 2: Various types of EPROMs, for example the units made by INTEL, No. 2716 or 2732, each include a plurality of memory cells which, essentially, include field effect transistors. A first field effect transistor is connected as a current source, and a further field effect transistors (FET), serially connected therewith, is so connected that its control gate can introduce charge carriers to the gate of the field effect transistors. At the tap point between the two serially connected FETs, a voltage can be picked off which characterizes the charge state of the controlled FET.

In accordance with convention, and usual definition, a logic signal 1 is present if the controlled FET is conductive, that is, if no charge carriers are applied to its control gate. The output voltage is low, approaching zero.

The characteristics of the output voltage in dependence on current applied is shown by the solid curve 16 in FIG. 2. The abscissa shows the voltage on the data terminal, the ordinate the current through the FET.

If a voltage pulse is applied to the gate of the control transistor, to program it for a logic-0, the gate of the FET has charge carriers applied which render the FET of high resistance. Consequently, a higher voltage appears at the center tap between the two serially connected FETs. The operating curve for the logic-0 is shown at 17.

Depending on the construction of the memory cell, it is possible that charge carriers which are not desired, or not deliberately controlled, can escape from the gate region of the FET; it is also possible that charge carriers reach an empty gate region. Losses in charge carriers can be caused by ambient humidity, temperatures, and the like; population increase of charge carriers can occur due to optical effects, that is, light reaching the gate.

Let is be assumed, first, that the memory cell is subjected to an undesired increase in charge carriers. The computer 1 will address and interrogate the data of a predetermined data or memory cell. The computer will recognize the 0 or 1-condition by testing if the interrogation voltage is above or below a certain critical threshold value shown at 18. At a predetermined current 19, which is predetermined by the constant current supply of the cell itself, that is, by the constant current FET thereof, the voltage will differ in dependence on the charge state of the cell. The interrogation voltage level, that is, the threshold or cut-over level 18, is determined in most of the memory cells by the supply voltage, and by the physical construction of the memory cell and the components thereof. The semiconductor memories above referred to, that is, for example the INTEL 2716 or 2732, provide for an interrogation voltage 18 of half the supply voltage. The supply voltage is supplied to the memory 4 by the voltage stabilized power supply unit 6, the output voltage of which is determined by a signal at the reference input 7. The level of the signal at the reference input 7 is essentially determined by the relationship of the resistors 8,9, with respect to each other.

In accordance with a feature of the invention, the relationship of the resistance values of the two branches of the voltage divider can be changed by suitable commands of the signal lines 5a, 5b from the I/O port 5 by selective connection of the resistors 10, 11 in parallel to the resistor 9. Under normal operating condition, transistor 12 is ON, so that the resistance of resistor 10 is, effectively, in parallel with the resistance of resistor 9. During a pause in the normal program of the computer 1, a certain cell within memory 4 is addressed by the computer, and the data are first read by reading the output with respect to the cell on the data bus 2. The computer 1 then activates the I/O port 5 to render transistor 13 conductive as well, so that now resistors 10 and 11 are effectively connected in parallel with resistor 9. This causes the reference voltage 7 to drop, and thus also a drop in the supply voltage to the memory 4.

Due to the internal coupling of the interrogation voltage 18 with the supply voltage, this means that the interrogation voltage likewise is shifted towards a level of lower voltage values, as shown schematically by the chain-dotted line 20, FIG. 2. The data from the memory cell are again read out, and supplied to the computer for comparison in the comparator thereof with the memory content from the same cell when read out at normal or standard supply and read-out values. If the characteristic 16 is known, and both values are equal, then the memory cell is in order.

Upon applying of charge carriers to the memory cell, the FET in the memory cell will become of higher resistance so that, if it is somewhat defective, its characteristic is shifted to a level of higher voltage, which is indicated by the family of curves 16a, 16b, 16c shown in broken lines. From a predetermined curve on—in the example curve 16c, and in a predetermined current, the lowered interrogation voltage is passed. If, previously, a logic-1 was read, the lowered interrogation voltage will result in reading of a logic-0. The computer will recognize in its comparison circuit that the charge population of the cell has slowly increased and has become defective. It is now possible to trigger an alarm signal over warning line 25, indicating that the memory cell within the memory 4—or a section, or the entire memory thereof—should be replaced or exchanged; alternatively, a refreshing read-in can be commanded at that step.

After the test, the computer again switches to normal operation by blocking transistor 13 over the I/O port 5 and output line 5b.

A similar test can then be carried out with respect to a different memory cell.

In accordance with a feature of the invention, the memory cell can also be tested by increasing the supply voltage to the EPROM. Line 5a is controlled by the I/O port 5, upon command from the computer 1, to block transistor 12. Now, the voltage will be only as determined by the resistors 8, 9, shifting the interrogation or read-out voltage towards the positive side. This permits testing if a logic-0 which may may have been stored, as represented by curve 17, has shifted towards the left, as shown by the broken lines 17a, 17b.

Comparison and testing is then done in the same way as with a lowered control voltage.

Varying the interrogation voltage, and/or the operating voltage, of the memory units can determine if integrated circuit components in the memory 4 have a trend towards changing the information or storage data content therein. An early warning or early determination can be made before the change in the operating characteristics is so serious that loss of information will result upon normal operating conditions. The overall system, computer 1 and memory 4, will continue to remain operative for a good period of time since, under normal operating conditions, the normal interrogation voltage dividing line 18 is so placed that unambiguous identification is possible—see the substantial difference in position between lines 16 and 17 with respect to voltage, when considering the current 19, which is predetermined in the system.

Warning signals can be obtained from bus 25 in suitable time to warn the user that the overall system requires maintenance and possible replacement of components, for example of a printed circuit board containing the memory elements. Another possibility is to cause the computer 1 to reprogram the memory cell and to test, again, if the memory cell operates properly.

Basically, the present invention is directed to recognize a trend towards change in information content, particularly in memory units which are inexpensive, such as EPROMs, while still permitting correct information and data to be retrieved under normal operating conditions. Thus, it is possible to recognize, in time, and before the memory cells becomes defective, that a possibility of future defects appears.

Checking of the memory cells, preferably, is done during pauses in the normal program. In this time, the computer 1 can carry out a subroutine in which the memory cells are checked, either individually, in groups, or all of them—depending on the time available and the operating speed of the computer.

Various changes and modifications may be made within the scope of the inventive concept. The referenced U.S. application Ser. No. 390,290, filed June 21, 1982, COZA, assigned to the assignee of this application, the disclosure of which is hereby incorporated by reference, describes a method and system to insure the integrity of data stored in memory units, particularly including EPROMs, if change in the characteristics of a data cell is to be expected, or has already occurred; in accordance with the COZA application, the original data are stored, together with the original address, in an auxiliary memory or in a spare memory cell at a location together with the replacement address, so that only the data stored at memory cells which have been recognized to have a trend towards becoming defective, are stored, together with the original address in a replacement address. Since, in a memory unit, from experience only a comparatively small number of memory cells become defective, only a small number of additional or redundant or initially vacant memory cells are required while still retaining the operating reliability of the overall system. Generating the replacement address can be made particularly simple by placing the replacement or auxiliary cells at predetermined locations with respect to the terminal addresses of the memory unit.

I claim:

1. Method to recognize change in the storage characteristics and affecting a stored memory content in a read-only memory (ROM) element, especially an erasable programmable read-only memory element (EPROM) having programmed memory cells,
in which a computer (1) is provided, capable of sequentially generating read-out command signals and the memory element or cells thereof are addressable by the computer, comprising the steps of reading-out a first time the memory content of addressed cells of the read-only memory element with a standard or design read-out voltage;

storing the memory content of the cells of the read-only memory element, as read out the first time, in a computer memory;

reading-out a second time the memory content of said previously addressed cells of the read-only memory with a read-out voltage which differs from said standard or design read-out voltage;

comparing the content stored in the computer memory, as read out the first time, with the data derived from the cells of the memory element as read-out said second time;

and generating an error signal upon non-concurrence of the data derived from the read-only memory element as read out the second time with the content of the computer memory.

2. Method according to claim 1 wherein said step of reading-out a second time the memory content of said previously addressed cells of the read-only memory comprises the step of:

increasing the read-out voltage applied to said previously addressed cells.

3. Method according to claim 1 wherein said step of reading-out a second time the memory content of said previously addressed cells of the read-only memory comprises the step of:

decreasing the read-out voltage applied to said previously addressed cells.

4. Method according to claim 1 wherein said step of reading-out a second time the memory content of said previously addressed cells of the read-only memory comprises the step of:

changing the read-out voltage in a first direction;

changing the read-out voltage in an opposite direction, and reading out the memory content of said previously addressed cells of the read-only memory a third time;

and comparing the memory content stored in the computer memory, as read out the first time, with the data derived from the cells of the memory element as read out both the second time and as read out the third time;

and the step of generating the error signal comprises generating the error signal upon non-concurrence of the data derived from the read-only memory element with the content of the computer memory as read out either the second time or the third time.

5. Method according to claim 1 wherein the step of reading-out a second time the memory content of said previously addressed cells of the read-only memory comprises changing the read-out voltage during said second time reading-out with respect to the standard or design read-out voltage;

and further including the step of controlling the change of the read-out voltage by the computer (1).

6. Method according to claim 1, wherein the step of generating the error signal comprises providing a warning signal if the comparison step indicates disconformity in the data read out the first time and a subsequent time.

7. Method according to claim 1, wherein said computer operates in accordance with a predetermined program;

and the computer further includes a subroutine or subprogram controlling said reading-out step the first time, changing of the read-out voltage, reading out the read-only memory element content a second time and said comparison step is carried out during a pause or program gap of the computer program.

8. In combination with a read-only memory (ROM), especially an erasable programmable read-only memory (EPROM), an incipient error recognition sytem to recognize change in the storage characteristics of memory cells in the read-only memory (ROM) element (4) having a voltage applying means to apply operating voltage to the memory element;

a computer (1) capable of sequentially generating read-out or interrogating signals, connected to said read-only memory element, and addressing selected addressable cells in the read-only memory, said computer having a computer having a computer memory, comprising means (8-13) coupled to the read-only memory for controlling an operating voltage applied to the read-only memory by the voltage applying means between at least two selected voltage levels, in which one of the voltage levels is at a standard or design level, and another voltage level is changed with respect to said standard or design level in increasing or decreasing direction;

and means (5) coupled to the voltage applying means connected to and controlled by the computer (1) for reading-out the memory of said read-only memory at (a) the standard or design voltage; and, also (b) at another voltage level;

the computer memory being connected for storing the content of the read-only memory during read-out of the content at said standard or design level;

said computer further including a comparator, the comparator being connected to and controlled by said selective voltage applying means (5) and connected to compare the stored memory content in the computer memory with the content of the read-only memory (ROM) being read out at said other voltage level, wherein said computer (1) provides sequentially generated read-out command signals, and the memory element, or cells thereof are addressable by the computer;

said computer controlling reading-out a first time the memory content of addressed cells of the read-only memory element with a standard or design read-out voltage;

storing the memory content of the cells of the read-only memory element, as read out the first time, in a computer memory;

reading-out a second time the memory content of said previously addressed cells of the read-only memory with a read-out voltage which differes from said standard or design read-out voltage;

comparing the content stored in the computer memory, as read out the first time, with the data derived from the cells of the memory element as read-out said second time;

and generating an error signal upon non-concurrence of the data derived from the read-only memory element as read out the second time with the content of the computer memory.

9. System according to claim 8, wherein said operating voltage controlling means includes a threshold circuit (8-13) having a controllable, variable threshold voltage.

10. System according to claim 8, further including a voltage stabilized power supply unit (16) connected to the memory elements (4), said power supply unit having a reference voltage terminal (7);

and wherein said means for controlling the predetermined or changed voltage level of the operating voltage for the read-only memory comprises means (8-13) for changing the reference voltage level connected to said reference voltage terminal.

11. System according to claim 8, further comprising means (5) connected to and controlled by the computer (1) for controlling the voltage level of the operating voltage applied to said read-only memory element.

12. System according to claim 8, wherein said computer (1) includes comparator means for comparing (a) data read-out from an addressed memory cell when the memory cell is supplied with operating voltage at said predetermined standard or design level voltage with (b) the data read-out when said memory cell is supplied with operating voltage at a voltage level which is changed with respect to said predetermined standard or design level.

13. System according to claim 12, further including warning signal means (25) connected to and controlled by said comparator means in a computer and providing a warning signal output if the comparator determines disconformity in the data read out under predetermined standard or design level voltage conditions and under changed voltage level conditions.

14. System according to claim 8, wherein said operating voltage at the voltage level is applied to said memory (4) upon interrogation or read-out of data.

* * * * *